United States Patent
Montemont

(10) Patent No.: US 8,823,571 B2
(45) Date of Patent: Sep. 2, 2014

(54) ASYNCHRONOUS DIGITISATION OF TRANSIENT SIGNALS FROM RADIATION DETECTORS

(71) Applicant: Commissariat a l'energie atomique et aux energies alternatives, Paris (FR)

(72) Inventor: Guillaume Montemont, Grenoble (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/713,408

(22) Filed: Dec. 13, 2012

(65) Prior Publication Data

US 2013/0147648 A1 Jun. 13, 2013

(30) Foreign Application Priority Data

Dec. 13, 2011 (FR) ...................................... 11 61546

(51) Int. Cl.
*H03M 1/12* (2006.01)
(52) U.S. Cl.
USPC ........................................... 341/155; 341/143
(58) Field of Classification Search
USPC ......................................... 341/143, 144, 155
See application file for complete search history.

(56) References Cited

U.S. PATENT DOCUMENTS

| 4,965,579 | A | 10/1990 | Liu et al. | |
|---|---|---|---|---|
| 6,850,180 | B2 | 2/2005 | Hales | |
| 6,940,444 | B1 | 9/2005 | Arigliano | |
| 6,977,601 | B1* | 12/2005 | Fletcher et al. | 341/143 |
| 7,218,264 | B1 | 5/2007 | Shefer | |
| 7,358,738 | B2* | 4/2008 | Overby et al. | 324/326 |
| 7,466,258 | B1 | 12/2008 | Akopyan et al. | |
| 7,847,556 | B2* | 12/2010 | Royle | 324/326 |
| 8,212,700 | B2* | 7/2012 | Zoso | 341/143 |
| 2003/0218561 | A1 | 11/2003 | Hales | |
| 2011/0210235 | A1 | 9/2011 | Dierickx | |
| 2012/0184848 | A1 | 7/2012 | Ohi et al. | |

FOREIGN PATENT DOCUMENTS

WO WO 97/07591 A1 2/1997
WO WO 2011/039819 A1 4/2011

OTHER PUBLICATIONS

French Preliminary Search Report issued Aug. 24, 2012 in Patent Application No. 1161546 with English Translation of Category of Cited Documents.

* cited by examiner

*Primary Examiner* — Brian Young
(74) *Attorney, Agent, or Firm* — Oblon, Spivak, McClelland, Maier & Neustadt, L.L.P.

(57) ABSTRACT

A device for sampling or digitising a detection signal from an X- or gamma-ray detector wherein, during a sampling time, estimations of a feedback signal are made at times when the signal injected to the inverting input of a comparator is equal to the detection signal at the non-inverting input of said comparator.

20 Claims, 3 Drawing Sheets

ASYNCHRONOUS DIGITISATION OF TRANSIENT SIGNALS FROM RADIATION DETECTORS

FIELD OF THE INVENTION

The present invention relates to the field of high-frequency electromagnetic radiation detection and more specifically that of X- or gamma-ray detection device signal processing.

It provides an enhanced method for digitising a detection signal in pulse form from an electromagnetic radiation detector and a device for digitising a detection signal.

The invention is particularly applicable in the field of spectrometric imaging, particularly for nuclear medicine, scintigraphy or photon tomography.

PRIOR ART

In the field of X- or gamma-ray spectrometry, an electronic processing chain makes it possible to form a spectrum from signals provided by a set of detectors.

Each signal from a detector is in the form of a pulse having an amplitude proportional to the energy of photons detected by the detector. This analogue signal is amplified, formatted and converted into a digital value.

The prior art includes digitisation devices wherein pulse amplitude encoding is performed.

These devices comprise at least one slow analogue-to-digital converter ADC having a conversion time in the region of 1 MS/s but having a high precision, which may be typically greater than 14 bits.

Ramp or successive approximation converters may be used to perform this digitisation.

With such a digitisation method, only a single amplitude data item per pulse is obtained, which is not suitable for a more detailed analysis of the detected signal.

The prior art also includes synchronous digitisation devices wherein a signal is sampled directly in the form of high-frequency pulses, at a preamplifier output of after a conditioning filter.

In this type of device, the analogue-to-digital converters used may be faster and less precise.

However, this type of device, when used for a large number of detection channels, gives rise to high consumption.

Synchronous delta-sigma analogue-to-digital conversion systems using for example a ramp converter, or a successive approximation converter, wherein a signal to be encoded is compared to an estimated signal, the comparison then being used to frame the signal between two envelopes, are also known.

Since the signals from X- or gamma-ray detectors are generally transient signals in the form of pulses representing rare and fast events, it may prove to be more effective to use asynchronous analogue-to-digital converters for digitisation.

The document U.S. Pat. No. 7,466,258 discloses an asynchronous digitisation device similar to a flash converter, provided with a plurality of parallel comparators comparing the signal to be encoded to a set of reference values and encoding the result asynchronously.

Such a device enables high-speed conversion but requires the use of a relatively large number of comparators, giving rise to a large size and high cost.

The document U.S. Pat. No. 7,218,264 discloses an asynchronous digitisation device with a plurality of stages wherein the operation is similar to a pipeline converter. This device requires one comparator per quantisation bit.

The document U.S. Pat. No. 4,965,579 also discloses an asynchronous multi-stage digitisation device requiring one comparator per stage and one comparator per quantisation bit.

The document U.S. Pat. No. 6,850,180 discloses a digitisation device wherein an input signal in pulse form is framed using two hysteresis comparators with a signal from an analogue-to-digital converter controlled by an asynchronous logic circuit which increases or decreases the amplitude of the signal according to the output of the comparator(s).

The document U.S. Pat. No. 6,940,444 describes an asynchronous approximation conversion system which has the drawback of being slow.

In this way, prior art analogue-to-digital conversion systems have the drawback either of being slow and imprecise or of having high consumption levels in terms of resources or power.

The problem to be addressed is that of finding a novel analogue-to-digital conversion system, suitable for converting detection signals from ionising electromagnetic radiation, such as X-ray or gamma-ray, detectors, which is enhanced with respect to the drawbacks mentioned above.

DESCRIPTION OF THE INVENTION

The present invention relates to a device for digitising or sampling a detection signal from an ionising electromagnetic radiation detector, particularly an X- or gamma-ray detector, wherein the energy is between a few eV and a few MeV, and essentially between 1 keV and 2 MeV.

This device comprises a comparator arranged so as to receive, on a first of the inputs thereof, a first signal referred to as the "detection signal", in the form of at least one pulse from the detector, and to deliver, based on a comparison with a second signal applied to a second of the inputs thereof, a two-state output signal.

This device also comprises means for controlling said second signal, acting as a feedback loop, the second signal being delivered to said second input and dependent on said output signal of said comparator, such that the direction of variation of said second signal is based on the state of said output signal of said comparator, the control means further comprising a "smoothing" filter.

The digitisation device according to the invention further comprises: means for estimating the second signal using switching times of said comparator output signal and the parameters of said smoothing filter.

The given parameters used to carry out this estimation may include at least one filter time constant.

According to one alternative embodiment, the digitisation device may further comprise:
means for storing said comparator switching times in memory,
means for storing values of a signal generated by said estimation means in memory, the digitisation being performed based on said values of said signal.

The control means may comprise sequencing means, to authorise the digitisation of said first signal during a given time $T_{samp}$.

The control means may further comprise, between the comparator output and said smoothing filter: a digital block having an output varying between a high-impedance state and a low-impedance state based on the state of said sequencing means.

The digital block may comprise:
switching means envisaged for,
when activated, modifying the output of said digital block based on said comparator output signal, when deactivated, setting said output of said digital block to a high-impedance state, the sequencing means being envisaged for activating said switching means during said sampling time based on a change of state of said comparator output signal.

The sequencing means may comprise at least one monostable multivibrator or a state machine.

The estimation means may be in the form of a digital, FPGA, or microprocessor, or ASIC circuit.

The smoothing filter may be in the form of an analogue or digital low-pass filter.

The control means may comprise a node connected to said second input, the node being connected to:
  means acting as at least one capacitance C,
  means acting as a first resistor $R_1$ connected at the output of said digital block,
  means acting as a second resistor $R_2$ connected to a fixed potential $V_E$ and such that $R_2 > R_1$.

According to one alternative embodiment, the estimation means may generate a discrete signal, the digitisation device further comprising: interpolation means for interpolating said discrete signal.

The present invention also relates to a device for detecting ionising electromagnetic radiation, particularly X- or gamma-rays, comprising a digitisation device as defined above.

The present invention also relates to a method for digitising a detection signal from an ionising electromagnetic radiation detector, comprising steps consisting of:
  comparing a first detection signal from said detector in the form of at least one pulse and a second signal and delivering, based on this comparison, a two-state output signal,
  controlling said second signal based on said output signal of said comparator, such that the direction of variation of said second signal is dependent on the state of said output signal of said comparator,
  estimating said second signal using switching times of said comparator output signal and smoothing filter parameters, The method may further comprise steps consisting of:
  storing the comparator switching times in memory,
  storing one of the estimation values of the second signal in memory.

BRIEF DESCRIPTION OF THE FIGURES

The present invention will be understood more clearly on reading the description of examples of embodiments which are given merely as an indication and are in no way limiting, with reference to the appended figures wherein.

Identical, similar or equivalent parts of the various figures bear the same reference numbers to enable easier comparison of the figures.

The various parts shown in the figures are not necessarily based on a uniform scale, so as to make the figures easier to read.

DETAILED DESCRIPTION OF PARTICULAR EMBODIMENTS

Figure 1:
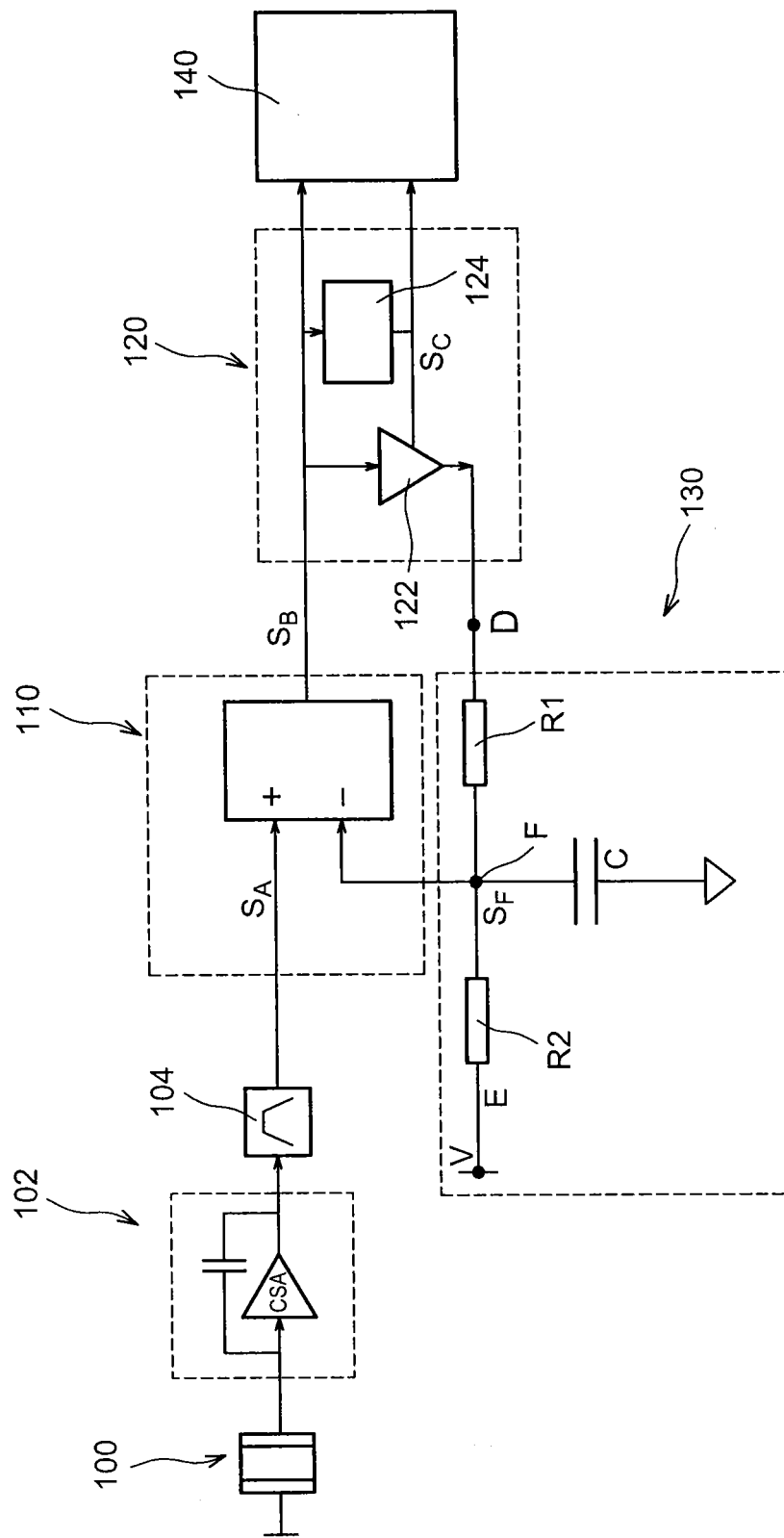
FIG. 1 illustrates an example of an analogue-to-digital conversion device according to the invention for converting pulse signals, particularly from gamma- or X-ray detectors.

An example of a digitisation or sampling device according to the invention, belonging to or associated with a microelectronic electromagnetic radiation detection device, particularly an X- or γ-ray detector device, is illustrated in FIG. 1.

The electronic detection device comprises at least one detector 100 consisting of a material wherein ionising radiation interacts, each interaction generating charge carriers, which are collected by electrodes arranged on one face of said detector equipment.

At the detector output, an amplification stage 102 comprising, for example, a Charge Sensitive Amplifier (CSA), and a filtering stage 104 comprising, for example, a low-pass filter may be provided, in order to amplify the signal detected and preserve the frequencies of interest wherein the signal-to-noise ratio is maximum, respectively.

The digitisation device firstly comprises means acting as a comparator 110 wherein a first input, for example a non-inverting input is placed at the output of the filtering stage 104.

In this way, an amplified and filtered detection signal $S_A$ is injected at the input of the comparator 110. This detection signal $S_A$ may be a transient signal, in the form of a pulse for example such as that for which a representative curve $C_{10}$ is given in FIG. 2.

On the second input of the comparator 110, for example the inverting input thereof, a signal $S_F$ from an analogue block 130 belonging to a feedback loop connected to the output of the comparator 110 is applied.

Figure 2:
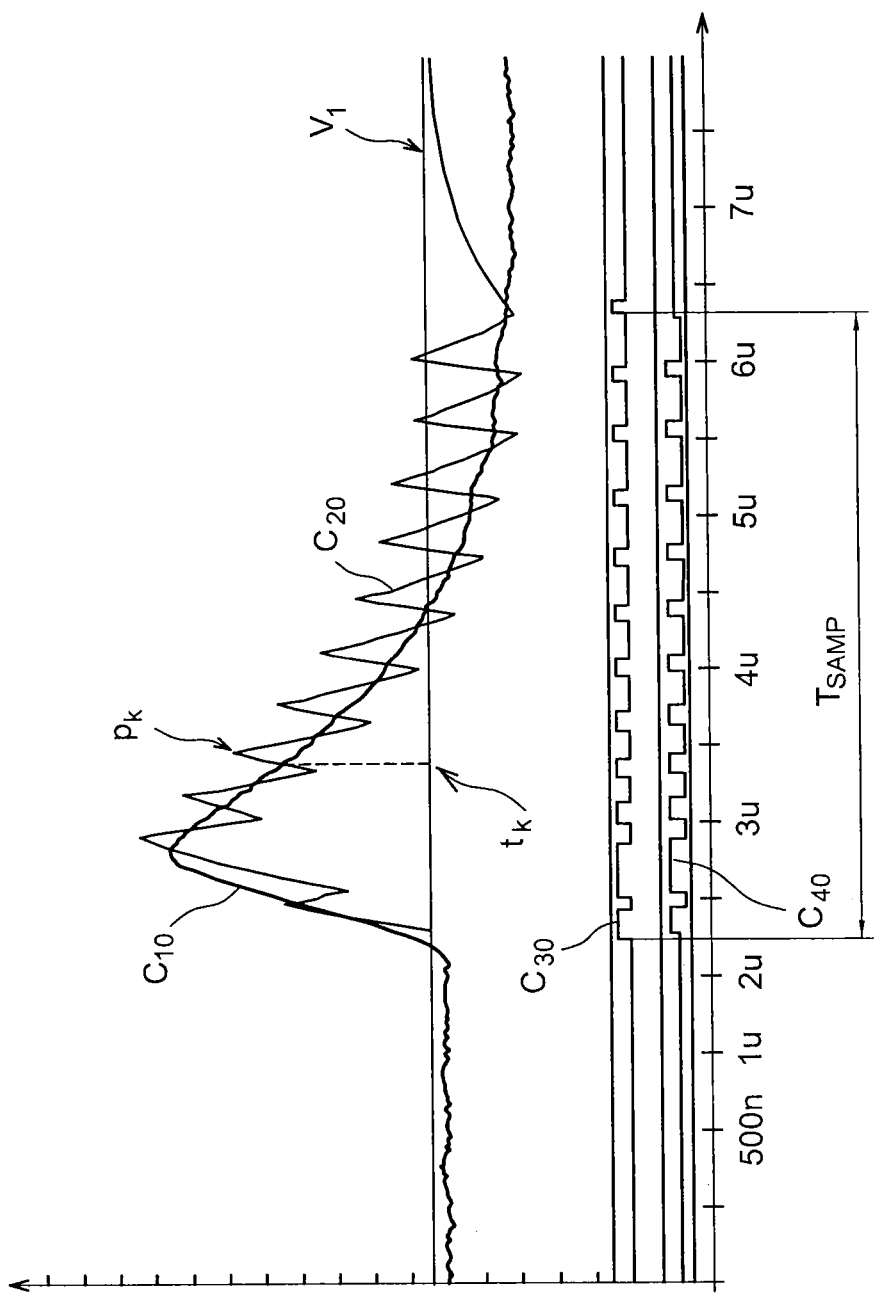
FIG. 2 illustrates examples of signals used in a high-frequency electromagnetic radiation detection device comprising a sampling or digitisation device embodied according to the invention.

An example of a representative curve $C_{20}$ of the analogue signal $S_F$ from said analogue block 130 is given in FIG. 2. The representative curve of the signal $S_F$ has a jagged format and follows the progression of the detection signal $S_A$, while oscillating around same.

In this way, the analogue signal $S_F$ applied at the inverting input of the comparator 110 accounts for previous variations of the amplified and filtered detection signal $S_A$.

Based on the result of the $S_A$-$S_F$ comparison performed by the comparator 110, the signal $S_B$ delivered at the output thereof may adopt a first state, for example a high state or a second state, for example a low state.

An example of representation $C_{30}$ of the signal delivered at the output of the comparator 110 in response to the signals represented by the curves $C_{10}$ and $C_{20}$ at the non-inverting input and inverting input, respectively, is also given in FIG. 2.

The digital output signal $S_B$ of the comparator 110 serves as an input signal for a digital block 120 belonging to the feedback loop between the output and the inverting input of the comparator 110.

This digital block 120 may consist of a 3-state logic gate 122 wherein the input may be connected to the output of the comparator 110 and which is intended to be activated or deactivated based on the state of an activation signal $S_C$ delivered by a sequencing block 124, the activation signal $S_C$ being in turn dependent on the output signal $S_B$ of the comparator 110.

According to one example, the gate 122 may be activated when the signal $S_C$ is in a high state, whereas it is deactivated when the signal $S_C$ is in a low state.

The sequencing block 124 may for example be envisaged for delivering an activation signal of the gate 122 based on changes of state of the output signal $S_B$ of the comparator 110.

The sequencing block 124 may for example be produced using a monostable multivibrator triggered for example by a rising edge of $S_B$ whereas the output $S_C$ is in the low state.

The term rising edge of $S_B$ refers to a change of state, from a low state to a high state of the digital output signal $S_B$ of the comparator 110. The sequencing block 124 makes it possible to keep, via the output $S_C$ thereof, the gate 122 activated during a given time $T_{samp}$. The time $T_{samp}$, during which the gate 122 is activated, is comparable to the duration of the pulse to be digitised.

The time $T_{samp}$ may for example be between 10 ns and 10 μs according to the detector 100 and the filter 104 used.

According to a further alternative, the sequencing block 124 may be implemented using a logic circuit acting as a state machine suitable for outputting an activation signal during a given period $T_{samp}$ or a given predetermined time $T_{samp}$ following a detection of a switch when the amplitude of the signal $S_A$ becomes greater than that of the analogue signal $S_F$ while the state machine output is in the low state.

This given period $T_{samp}$ or given time $T_{samp}$ (shown in FIG. 2) consists of a time during which sampling may be carried out.

The sampling device may thus be envisaged such that, outside the sampling period $T_{SAMP}$, the digital block 120 is idle. If this block is based on CMOS technology, for example, the consumption thereof is minimal outside the sampling period.

Following the given period $T_{samp}$, the gate 122 is deactivated again.

The term "deactivated" means that, regardless of the output signal $S_B$ of the comparator 110 applied at the input of the gate 122, the output D thereof is unchanged and for example set to a high-impedance state.

Following a sampling period, it is possible to keep the digital block idle for a predetermined period $T_{inhib}$. This may be carried out by arranging an additional monostable multivibrator (not shown), deactivating the block 124 for a time $T_{inhib}$, when the state of the signal $S_C$ switches from 1 to 0, regardless of $S_B$.

The switching of the state of the signal $S_C$ from 1 to 0 consists of deactivating the gate 122 mentioned above.

When the gate 122 is "activated" during the given time $T_{samp}$, the state of the output D thereof is dependent on that of the output $S_B$ of the comparator 110.

The operation of the gate 122 may be such that, when activated, for example by a high state of the output signal $S_C$ of the block 124, the output thereof is set to a "low" state when the signal $S_B$ is in the "low" state and the output thereof is set to a "high" state when the signal $S_B$ is in the "high" state.

The gate 122 thus acts as switching means wherein activation is controlled by the activation signal $S_C$ and wherein the state, when activated, is dependent on that of the signal $S_B$. The gate 122 for example consists of CMOS logic gates.

In this example, the output D of the digital module 120 forms an input of the analogue block 130 delivering the inverting input signal of the comparator 130 and completing the feedback loop.

The analogue block may consist of means acting as a filter for smoothing the signal delivered to the output D of the digital module, for example low-pass filtering. The signal delivered to the output D of the digital module consists of the output of the gate 122, said gate being dependent on the output $S_B$ of the comparator 110. In this way, as a general rule, the analogue block 130 is suitable for smoothing the output signal of the comparator $S_B$. Such smoothing may be obtained using an RC filter.

The analogue block 130 may comprise a node F connected to the inverting input of the comparator 110 and to which means acting as a capacitor C also connected to a ground potential GND or Vss may be connected.

Means acting as a first resistor $R_1$ are formed between the output D of the digital module 120 and the node F, whereas means acting as a second resistor $R_2$ are envisaged between a node E set to a potential $V_E$ and the node F. When the output D is set to high-impedance mode, wherein the signal Sc is 0 or in a low state, the smoothing filter time constant is: $1/R_1C$. When the output D is set to pass-through mode, the signal Sc is 1 or in a high state, the smoothing filter time constant is: $1/R_2C$.

The values of the first resistor $R_1$, the second resistor $R_2$, and the capacitor C, may be envisaged based on a prediction or an estimation of the signal $S_A$ delivered at the non-inverting input of the comparator 110, particularly an estimation of the slope thereof.

More specifically, the smoothing is performed such that the slope of the feedback signal, after smoothing, is greater than the maximum slope of the pulse received at the device input and to be digitised. The slope thereof should for example be between 1+ϵ where ϵ for example belongs to [0;1] and 2 times the maximum slope of the pulse to be digitised.

The term feedback signal refers to the signal $S_F$ applied at the inverting input of the comparator 110 during sampling when the signal Sc=1 or is in the high state. It consists of the signal applied at the inverting input of the comparator 110 under the effect of the switching thereof. In this example, this signal is controlled by the gate 122.

The potential $V_E$ is a fixed potential, suitable for establishing an initial value $V_1$ of the signal $V_F$ at the inverting input of the comparator 110, when the output D of the digital module is in high impedance before the pulse starts. This value $V_1$ is envisaged so as to prevent untimely switching of the comparator output before the start of pulse sampling.

In this way, it is possible to envisage values for $R_1$, $R_2$, and C, based on a prior estimation of the gradient or slope of a signal to be detected. For example, for a signal such as that illustrated by the curve $C_{10}$ in FIG. 2, an estimation of a portion between 2.2 μs and 2.7 μs, i.e. the steepest portion of the curve $C_{10}$ may be used to determine values for $R_1$, $R_2$, and C.

The first resistor $R_1$ may be envisaged as greater than the second resistor $R_2$. The first resistor $R_1$ may be envisaged for example in the region of 100 kΩ whereas the second resistor $R_2$ may be envisaged for example in the region of 20 kΩ, the capacitor C being for example in the region of 10 pF.

The low-pass filter may have a first "slow" time constant $\tau_1$ in the region of $R_1*C$ when the output D of the digital module 120 is in low impedance due for example to a high state of the activation signal SC when the 3-state gate 122 is active.

The low-pass filter may also have a second "fast" time constant $\tau_2$ in the region of $R_2*C$ when the output D of the digital module 120 is in high impedance due to a low state of the signal $S_C$ when the 3-state gate 122 is inactive. Having a fast time constant $\tau_2$ enables the inverting input to restore the idle state $V=V_E$ quickly after the end of the sampling period. The inhibition period $T_{inhib}$ described above may be defined on the basis of this fast time constant $\tau_2$.

According to one alternative embodiment, the time constants $\tau_1$ and $\tau_2$ may be of the same order of magnitude.

Figure 4A:
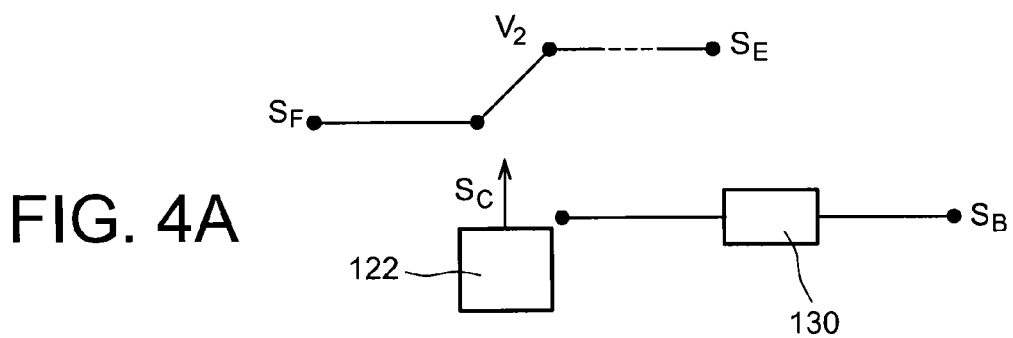
FIGS. 4A and 4B illustrate various operating modes and a digitisation device according to the invention.
Figure 4B:
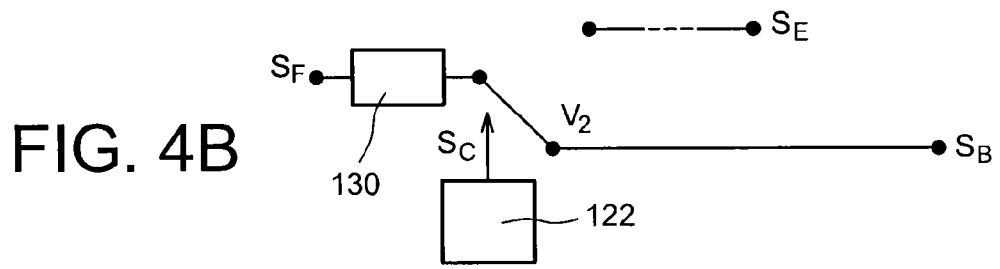

In this way, as a general rule, the digitisation device may switch from an "inactive" or "inhibited" mode to an "active"

or "digitisation" mode, under the effect of the switch 122, as illustrated in FIGS. 4A and 4B.

When the device is inhibited, the non-inverting input of the comparator 110 is connected to a fixed potential $V_E$ whereas in digitisation mode, the non-inverting input is connected to the output of the comparator 110, via the smoothing filter.

This smoothing filter may be analogue, as in the example given above, or, according to further alternatives, be digital or comprise a digital part and an analogue part.

The sampling of the signal $S_A$ may be such that the values thereof captured are captured irregularly and consist of time points of the signal $S_A$ where said signal is equal to the analogue signal $S_F$.

In FIG. 2, intersection points $p_k$ where $k \in [1;n]$ (wherein n is an integer) between the curve $C_{10}$ of the detection signal at the non-inverting input of the comparator 110 and that $C_{20}$ of the analogue feedback signal $S_F$ at the inverting input of the comparator 110 are illustrated.

These intersection points are the sampling points of the detection signal $S_A$ to be determined or evaluated using the device according to the invention.

These sampling points $p_k$ consists, within at least one propagation time, to the switching times $t_k$ of the comparator output signal $S_B$. This propagation time may be for example 10 ns.

In this way, the switching times of the comparator 110, determined by the variations of the comparator output signal $S_B$, may be processed to determine the times $t_k$ when the amplitude of the detection signal $S_A$ is equal to that of the signal $S_F$ (the curve of the detection signal $S_A$ and the curve of the analogue feedback signal $S_F$ intersecting at the times $t_k$ indicated in FIG. 2).

A shift register or a counter may optionally be used for optionally storing a log of the switching times of the comparator 110.

In other words, as a general rule, during the sampling of the signal $S_A$ delivered by the detector, the switching times of the comparator 110 are recorded, said times consisting of the times at which the value of the pulse $S_A$ is equal to the feedback signal $S_F$ applied to the comparator, said signal being generated each time the comparator is switched.

Figure 3:
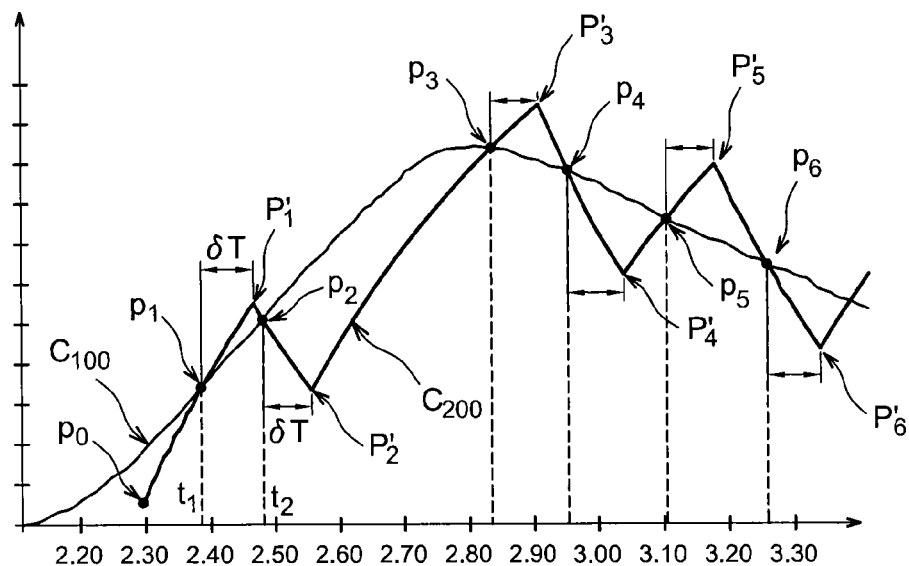
FIG. 3 illustrates further examples of signals used in an ionising electromagnetic radiation detection device according to the invention.

As illustrated in FIG. 3 by the curves $C_{100}$ and $C_{200}$ respectively representing a detection signal $S_A$ and a feedback signal $S_F$ at the inverting input of the comparator 110, the times when the feedback signal $S_F$ reaches the peaks $P'_k$ $k \in [1;n]$ (where n is an integer) also consist of the sampling times $t_k$, within the propagation delay $\delta T$ in the feedback loop.

At a point $p_0$, the value of the signal $S_A$ exceeds a threshold $V_1$, which activates digitisation. The feedback signal increases the feedback signal $S_F$ applied at the non-inverting input of the comparator 110 under the effect of a high state at the output of the comparator $S_B$.

At a time $t_1$ (point $p_1$), the amplitude of the feedback signal becomes equal to that of the detection signal $S_A$. Switching of the comparator 110 is then activated and the output signal $S_B$ of the comparator 110 switches to the low state. After this time $t_1$, the amplitude of the signal $S_A$ is less than that of the signal $S_F$. The slope of the feedback signal $S_F$ then reaches a local maximum (point $P'_1$), and then declines. The time shift between the time $t_1$ and the local maximum of the subsequent feedback signal consists of the feedback loop delay $\delta T$.

At a time $t_2$ (intersection point $p_2$ between $C_{100}$ and $C_{200}$), the feedback signal $S_F$ and the detection signal $S_A$ have equal amplitudes, the output signal $S_B$ of the comparator 110 switching to the high state. After this time $t_2$, the amplitude of the signal $S_F$ is less than that of the detection signal $S_A$, the signal $S_F$ first reaching a local minimum (point $P'_2$), and then increasing. The time shift between the time $t_2$ and the local minimum of the subsequent feedback signal consists of the feedback loop delay $\delta T$.

At a time $t_3$ (intersection point $p_3$ between $C_{100}$ and $C_{200}$), the comparator 110 switches and the output signal $S_B$ thereof switches to the low state. For this reason, the slope of the feedback signal $S_F$ decreases, the signal reaching a local maximum (point $P'_3$), and then declining.

The time shift between the time $t_3$ and the local maximum point $P'_3$ of the subsequent feedback signal consists of the feedback loop delay $\delta T$.

As a general rule, the feedback signal $S_F$ controlled by the switching of the comparator 110, frames the detection signal $S_A$ to be digitised by being controlled by the comparator output, the slope, or direction of variation, of the feedback signal increasing when $S_F < S_A$ and decreasing when $S_F > S_A$.

The amplitude values of the detection signal $S_A$ consisting of the intersection times between $S_A$ and the signal $S_F$ may be determined using estimation means 140 in the form of a digital module 140. These estimation means 140 comprise calculation means using an estimation of these intersection times and suitable for calculating the following first-order differential equation:

$$dS_F/dt = (S_D - S_F)/(R_1 * C) + (S_E - S_F)/(R_2 * C).$$

Steps of the sampling or digitisation method implemented according to the invention will now be described:

Switching times or time points $t_k$ are extracted from the comparator, for example in the form of a signal $S_G$.

A digital reconstruction of the signal $S_F$ is then performed. For this, an estimation of the signal $S_F$ is performed using the signal $S_B$, propagation times of the various components of the feedback loop and knowledge of the smoothing filter parameters, particularly the time constant thereof.

The delay between a time when the signals $S_F$ and $S_A$ are equal triggering switching of the comparator and an inflection of the signal $S_F$ following this time consists of a feedback loop propagation time $\delta T$ or response time.

This digital reconstruction is suitable for producing a discrete digital signal $S_F'$. The digital reconstruction may be performed using a digital computation circuit, comprising for example a microprocessor, or a field programmable gate array (FPGA) or an Application-Specific Integrated Circuit (ASIC). In this way, the reconstruction of the signal $S_F$ is obtained based on the response of the feedback loop following each activation of the comparator 110.

The digital signal $S_F'$ at the switching time points $t_k$ forming the signal $S_G$ may then be stored in memory, the time points being suitable for being corrected based on the comparator switching time.

Interpolation may then be performed between the various signals stored in memory during the previous step.

The invention claimed is:

1. A device for digitising a detection signal from an ionising electromagnetic radiation detector comprising:
    a comparator for receiving, on a first of the inputs thereof, a first detection signal from said detector in the form of at least one pulse, and delivering, based on a comparison with a second signal applied to a second of the inputs thereof, a two-state output signal,
    a control device acting as a feedback loop controlling said second signal based on the output signal of said comparator, such that the direction of variation of said second signal is dependent on the state of said output signal of said comparator , the control device comprising a smoothing filter having given parameters, an estimation device for estimating the second signal using switching times of said output signal of the comparator and said given parameters of said smoothing filter, the device for digitizing further comprising:
a storing device for storing said comparator switching times in memory, and
a device for storing values of a discrete signal generated by said estimation device in memory, the digitisation being performed based on said values of said discrete signal.

2. A device according to claim 1, wherein the control device comprises a sequencing device, to authorize the digitisation of said first signal during a given time.

3. A device according to claim 2, wherein the control device comprises, between the comparator output and said smoothing filter: a digital block having an output varying between a high-impedance state and a low-impedance state based on the state of said sequencing device.

4. A device according to claim 3, the digital block comprising:
switching device envisaged for:
when activated, modifying the output of said digital block based on said comparator output signal,
when deactivated, setting said output of said digital block to a high-impedance state, the sequencing device being adapted to activate said switching device during said sampling time based on a change of state of said comparator output signal.

5. A device according to claim 4, wherein the sequencing device comprises at least one monostable multivibrator or a state machine.

6. A device according to claim 1, wherein the estimation device is in the form of a digital, FPGA, or microprocessor, or ASIC circuit.

7. A device according to claim 1, wherein the smoothing filter is in the form of an analogue or digital low-pass filter.

8. A device according to claim 1, wherein the control device comprises a node connected to said second input, the node being connected to:
a device acting as at least one capacitance C,
a device acting as a first resistor $R_1$ connected at the output of a digital block provided between the comparator output and said smoothing filter, and
a device acting as a second resistor $R_2$ connected to a fixed potential $V_E$ and such that $R_2 > R_i$.

9. A device according to claim 1, wherein the estimation device generate a discrete signal, the device further comprising: interpolation device for interpolating said discrete signal.

10. A device for detecting ionising electromagnetic radiation, particularly X- or gamma-rays, comprising a device according to claim 1.

11. A method for digitising a detection signal from an ionising electromagnetic radiation detector, comprising steps of:
comparing a first detection signal from said detector in the form of at least one pulse and a second signal, and delivering, based on this comparison, a two-state output signal,
controlling said second signal based on said output signal of said comparator, such that the direction of variation of said second signal is dependent on the state of said output signal of said comparator,
estimating a value of said second signal using switching times of said comparator output signal and smoothing filter parameters,
storing the comparator switching times in memory, and
storing one of the estimation values of the second signal in memory.

12. A device for digitising a detection signal from an ionising electromagnetic radiation detector comprising:
a comparator for receiving, on a first of the inputs thereof, a first detection signal from said detector in the form of at least one pulse, and delivering, based on a comparison with a second signal applied to a second of the inputs thereof, a two-state output signal,
a control device acting as a feedback loop controlling said second signal based on the output signal of said comparator, such that the direction of variation of said second signal is dependent on the state of said output signal of said comparator , the control device comprising a smoothing filter having given parameters,
an estimation device for estimating the second signal using switching times of said output signal of the comparator and said given parameters of said smoothing filter, wherein the estimation device is in the form of a digital, FPGA, or microprocessor, or ASIC circuit.

13. A device according to claim 12, further comprising:
a storing device for storing said comparator switching times in memory, and
a device for storing values of a discrete signal generated by said estimation device in memory, the digitisation being performed based on said values of said discrete signal.

14. A device according to claim 12, wherein the control device comprises a sequencing device, to authorise the digitisation of said first signal during a given time.

15. A device according to claim 14, wherein the control device comprises, between the comparator output and said smoothing filter: a digital block having an output varying between a high-impedance state and a low-impedance state based on the state of said sequencing device.

16. A device according to claim 15, the digital block comprising:
switching device envisaged for:
when activated, modifying the output of said digital block based on said comparator output signal,
when deactivated, setting said output of said digital block to a high-impedance state, the sequencing device being adapted to activate said switching device during said sampling time based on a change of state of said comparator output signal.

17. A device according to claim 16, wherein the sequencing device comprises at least one monostable multivibrator or a state machine.

18. A device according to claim 12, wherein the smoothing filter is in the form of an analogue or digital low-pass filter.

19. A device according to claim 12 wherein the control device comprises a node connected to said second input, the node being connected to:
a device acting as at least one capacitance C,
a device acting as a first resistor $R_1$ connected at the output of a digital block provided between the comparator output and said smoothing filter, and
a device acting as a second resistor $R_2$ connected to a fixed potential $V_E$ and such that $R_2 > R_1$.

20. A device according to claim 12, wherein the estimation device generate a discrete signal, the device further comprising: interpolation device for interpolating said discrete signal.

* * * * *